United States Patent
Zhang et al.

(10) Patent No.: US 9,478,491 B1
(45) Date of Patent: Oct. 25, 2016

(54) INTEGRATED CIRCUIT PACKAGE SUBSTRATE WITH OPENINGS SURROUNDING A CONDUCTIVE VIA

(71) Applicant: Altera Corporation, San Jose, CA (US)

(72) Inventors: Jianmin Zhang, Los Gatos, CA (US); Myung June Lee, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/170,294

(22) Filed: Jan. 31, 2014

(51) Int. Cl.
H01L 23/48 (2006.01)
H05K 1/18 (2006.01)
H01L 23/522 (2006.01)
H01L 21/768 (2006.01)

(52) U.S. Cl.
CPC ..... *H01L 23/5226* (2013.01); *H01L 21/76879* (2013.01)

(58) Field of Classification Search
CPC .............. H01L 23/48; H01L 2224/16237; H05K 1/18; H05K 1/0274
USPC .......... 257/774.773, 676, 70, 700, 758, 728, 257/670
See application file for complete search history.

(56) References Cited

U.S. PATENT DOCUMENTS

| | | | | |
|---|---|---|---|---|
| 5,444,189 | A * | 8/1995 | Nakaso | H05K 3/0055 174/255 |
| 5,639,989 | A * | 6/1997 | Higgins, III | 174/386 |
| 6,607,780 | B1 * | 8/2003 | Natarajan | H01L 21/486 156/253 |
| 6,919,062 | B1 * | 7/2005 | Vasileiadis | C07C 29/1518 423/437.1 |
| 7,535,093 | B1 * | 5/2009 | Ables et al. | 257/698 |
| 7,935,896 | B2 | 5/2011 | Morlion et al. | |
| 8,742,590 | B2 * | 6/2014 | Beyne | H01L 21/764 257/773 |
| 8,956,949 | B2 * | 2/2015 | Hurwitz et al. | 438/422 |
| 2002/0148289 | A1 * | 10/2002 | Isogai | G01F 1/6845 73/204.26 |
| 2005/0014035 | A1 * | 1/2005 | Nakagiri et al. | 428/901 |
| 2005/0121768 | A1 * | 6/2005 | Edelstein | H01L 21/486 257/698 |
| 2006/0001174 | A1 * | 1/2006 | Matsui | 257/774 |
| 2007/0085200 | A1 * | 4/2007 | Lu et al. | 257/724 |
| 2007/0297729 | A1 * | 12/2007 | Kodama et al. | 385/94 |
| 2009/0015266 | A1 * | 1/2009 | Narita | H05K 1/0268 324/603 |
| 2010/0289596 | A1 * | 11/2010 | Makino et al. | 333/32 |
| 2011/0031633 | A1 * | 2/2011 | Hsu et al. | 257/777 |
| 2011/0175136 | A1 * | 7/2011 | Lin et al. | 257/99 |
| 2011/0187482 | A1 * | 8/2011 | Ohno et al. | 333/254 |
| 2011/0267152 | A1 * | 11/2011 | Lee | 333/26 |
| 2012/0139127 | A1 * | 6/2012 | Beyne | H01L 21/764 257/774 |
| 2012/0199380 | A1 | 8/2012 | Olsen | |
| 2013/0012145 | A1 * | 1/2013 | Shibuya | H01P 3/12 455/90.3 |
| 2013/0056253 | A1 | 3/2013 | Biddle et al. | |
| 2013/0147020 | A1 * | 6/2013 | Gonska | B81C 1/00095 257/621 |
| 2013/0256850 | A1 | 10/2013 | Danny et al. | |
| 2013/0288429 | A1 * | 10/2013 | Jacquet | B81B 7/007 438/107 |
| 2014/0291001 | A1 * | 10/2014 | Lin et al. | 174/261 |
| 2015/0041988 | A1 * | 2/2015 | Uzoh et al. | 257/774 |
| 2015/0279724 | A1 * | 10/2015 | Wu | H01L 21/76807 438/637 |
| 2015/0296610 | A1 * | 10/2015 | Daghighian | H05K 3/4688 385/14 |

* cited by examiner

Primary Examiner — Alexander Oscar Williams

(57) ABSTRACT

Integrated circuit packages with openings surrounding a conductive via on a substrate layer are disclosed. An integrated circuit package may include a substrate layer with upper and lower surfaces. A conductive via may extend between the upper and lower surfaces of the substrate layer. The integrated circuit package further includes multiple openings in the substrate layer that may be distributed evenly in the substrate layer surrounding the conductive via. The multiple openings reduce signal insertion loss of the conductive via.

25 Claims, 7 Drawing Sheets

INTEGRATED CIRCUIT PACKAGE SUBSTRATE WITH OPENINGS SURROUNDING A CONDUCTIVE VIA

BACKGROUND

As demand for higher speed and higher density integrated circuit devices grows, signal and power integrity have become increasingly crucial in the design of high-speed integrated circuits. As such, the application of a multi-layer substrate becomes an important component for the manufacturing of integrated circuits. Generally, a multi-layer substrate may include stacked metal layers on which printed circuit patterns are formed and insulating layers formed between the metal layers. Depending on design requirements, via holes or vias may be formed in the substrate to make electrical connections between the metal layers.

In general, the capacitive behavior of vias reduces the characteristic impedance of the vias. Subsequently, a significant impedance mismatch or discontinuity may occur between the vias and the substrate, as signal frequency increases. An impedance mismatch creates reflections that may corrupt the integrity of the signal data stream, which increases jitter and degrades signal quality.

SUMMARY

In accordance with the present invention, apparatuses and methods are provided for creating an integrated circuit package with openings surrounding a conductive via on a substrate layer.

It is appreciated that the present invention can be implemented in numerous ways, such as a process, an apparatus, a system, or a device. Several inventive embodiments of the present invention are described below.

An apparatus may include a substrate layer with upper and lower surfaces. A conductive via may extend between the upper and lower surfaces of the substrate layer. The apparatus may further include multiple openings in the substrate layer that surround the conductive via.

Circuitry is disclosed. The circuitry includes a substrate and a signal path on the substrate. The signal path may further include a via in the substrate. The circuitry may also include at least one opening in the substrate adjacent to the via to reduce signal insertion loss of the via.

A method of packaging an integrated circuit is disclosed. The method may include forming a conductive via in a substrate layer. Multiple openings may also be formed in the substrate layer adjacent to the conductive via. The openings may be distributed evenly surrounding the conductive via. This arrangement may reduce insertion loss of the conductive via during signal propagation through the openings.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques that include openings surrounding a conductive via on a substrate layer.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
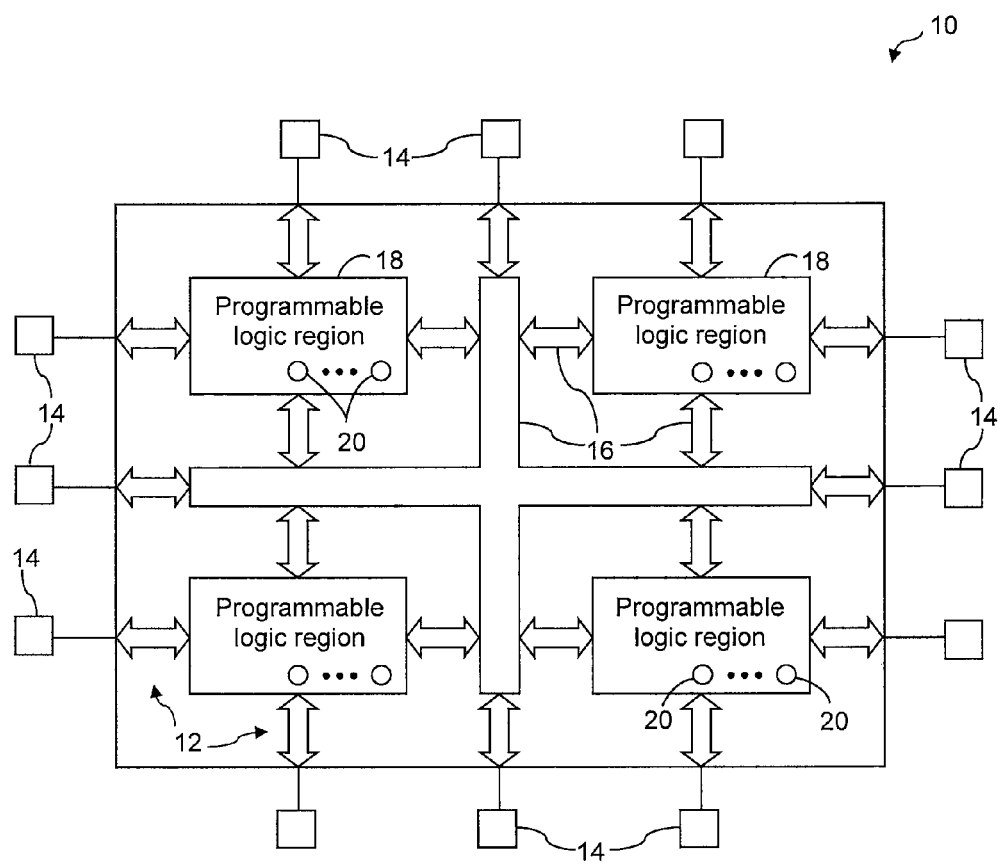
FIG. 1 is a diagram of an illustrative integrated circuit in accordance with an embodiment of the present invention.

FIG. 1 is a diagram of an illustrative integrated circuit 10 in accordance with an embodiment of the present invention. Programmable integrated circuit 10 may have input/output circuitry 12 for driving signals off of integrated circuit 10 and for receiving signals from other circuits or devices via input/output pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). Programmable logic region 18 may include combinational and sequential logic circuitry. The programmable logic region 18 may be configured to perform a custom logic function. The programmable interconnects associated with interconnection resources 16 may be considered to be a part of programmable logic region 18.

A typical memory element 20 is formed from a number of transistors configured to form cross-coupled inverters. For example, complementary metal-oxide-semiconductor (CMOS) integrated circuit technology may be used to form memory elements 20 with one suitable approach. In the context of programmable logic device integrated circuits, the memory elements may store configuration data and are therefore sometimes referred to as configuration random-access memory (CRAM) cells.

Memory elements 20 are generally arranged in an array pattern. In a programmable logic device, there may be millions of memory elements 20 on each chip. A user (e.g., a logic designer) may provide configuration data for the array of memory elements during programming operation. Once loaded with configuration data, memory elements 20 may selectively control (e.g., turn on and off) portions of the circuitry in programmable logic region 18 and thereby customize its functions as desired.

When memory elements 20 are arranged in an array, horizontal and vertical conductors and associated control circuitry may be used to access the memory elements 20. The control circuitry may, for example, be used to clear all or some of the memory elements. The control circuitry may also write data to the memory elements 20 and may read data from the memory elements 20. For example, in CRAM arrays, memory elements 20 may be loaded with configuration data. The loaded configuration data may then be read out from the memory array to confirm proper data capture before integrated circuit 10 is used during normal operation in a system.

The circuitry of integrated circuit 10 may be organized using any suitable architecture. For instance, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

In high speed circuit designs, programmable logic regions 18 may be arranged into circuit blocks with different speed requirements. Such blocks may be configured to handle high and low signal data transmission on integrated circuit 10. However, as signal speed increases, problems such as noise, crosstalk, and reflections may adversely affect the high-frequency components of a signal and impede the response of the signal.

Integrated circuit 10 may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Figure 2:
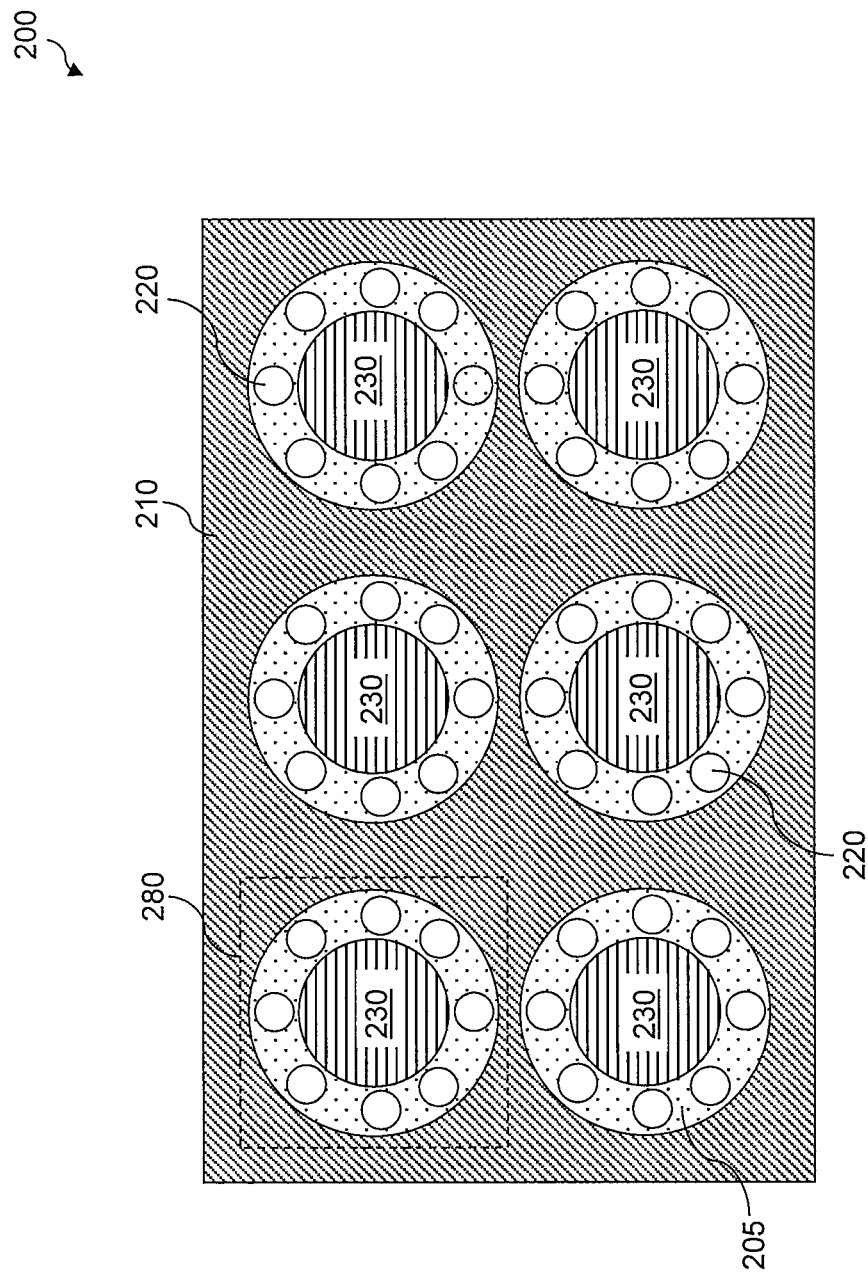
FIG. 2 is a top view of an illustrative package substrate layer having multiple conductive vias in accordance with one embodiment of the present invention.

FIG. 2 is a top view of an illustrative package substrate 200 having multiple conductive vias in accordance with one embodiment of the present invention. Package substrate 200 may include substrate layer 205. A typical dielectric constant (k) of substrate layer 205 is 3.5. A thin-film metal layer (e.g., metallization layer 210) may be formed on the upper and/or lower layer of substrate layer 205. In one embodiment, metallization layer 210 may serve as a required conductor pattern for the interconnection of various integrated circuit components on the integrated circuit.

One or more via holes such as conductive vias 230 may be formed (e.g., by drilling or laser) in substrate layer 205. Each of conductive vias 230 (may be surrounded by at least one opening. As shown in FIG. 2, openings 220 may be circular openings. However, it should be appreciated that openings 220 may have other suitable shapes such as a triangular shape, a polygonal shape, etc. A more detailed description of openings 220 will be described later with reference to substrate region 280 of FIG. 3.

Figure 3:
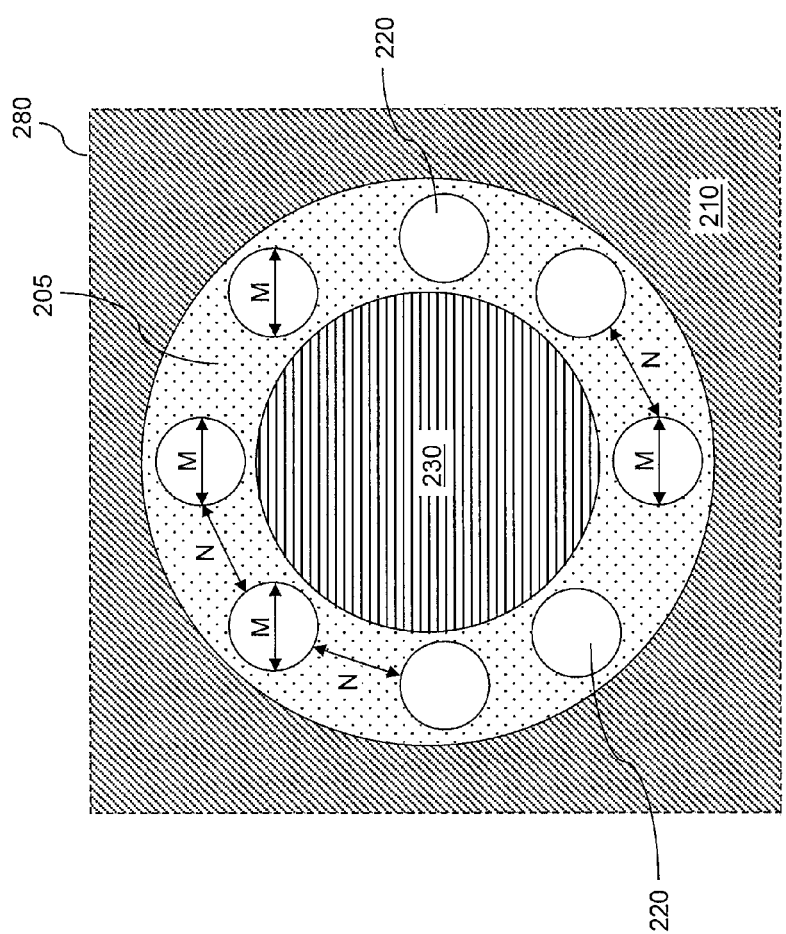
FIG. 3 is a top view of a substrate region of an illustrative substrate layer in accordance with one embodiment of the present invention.

FIG. 3 is a top view of substrate region 280 of package substrate 200 of FIG. 2 in accordance with one embodiment of the present invention. It should be appreciated that for the sake of brevity, components already shown in package substrate 200 of FIG. 2 (e.g., metallization layer 210, substrate layer 205) and described above will not be repeated. Substrate region 280 may include openings 220 that surround conductive via 230. In one embodiment, openings 220 may be filled with air, a material having a dielectric constant of 1. In another embodiment, openings 220 may be filled with low loss material (e.g., epoxy resin) that has dielectric constant that is lower than that of substrate layer 205. A typical substrate layer may have a dielectric constant of 3.5. When openings 220 are formed in substrate layer 205 that has a relatively high dielectric constant (e.g., dielectric constant of about 3.3), the effective dielectric constant $\in_{eff}$ of the entire substrate layer 205 may be reduced (e.g., $1 < \in_{eff} < 3.3$) by openings 220. Such an arrangement may reduce discontinuities in the dielectric constant between conductive via 230 and signal traces (not shown in the figure) in substrate layer 205 and/or metallization layer 210 when signals pass through conductive via 230.

In general, the size of conductive via 230 may depend on the core thickness of substrate layer 205. For example, the size of conductive via 230 may be about 100 to 200 μm. The size of openings 220 that surround conductive via 230, however, is independent to the size of conductive via 230. For example, as shown in FIG. 3, each opening 220 has a diameter M. The diameter M of each opening 220 may be, for example, about 50 to 200 μm.

In another embodiment, each of openings 220 may have substantial differences in size. It should also be appreciated that even though only eight openings 220 are shown in the embodiment of FIG. 3, depending on the requirements of the substrate layer, fewer or more openings may be formed.

Openings 220 may be distributed substantially evenly to surround conductive via 230. Such an arrangement may lower the dielectric constant of substrate layer 205. For example, openings 220 may be spaced apart by a specific distance (or gap) from each other. As shown in FIG. 3, openings 220 are spaced apart from each other by a distance N. The distance N may be, for example, about 50 μm.

Figure 4:
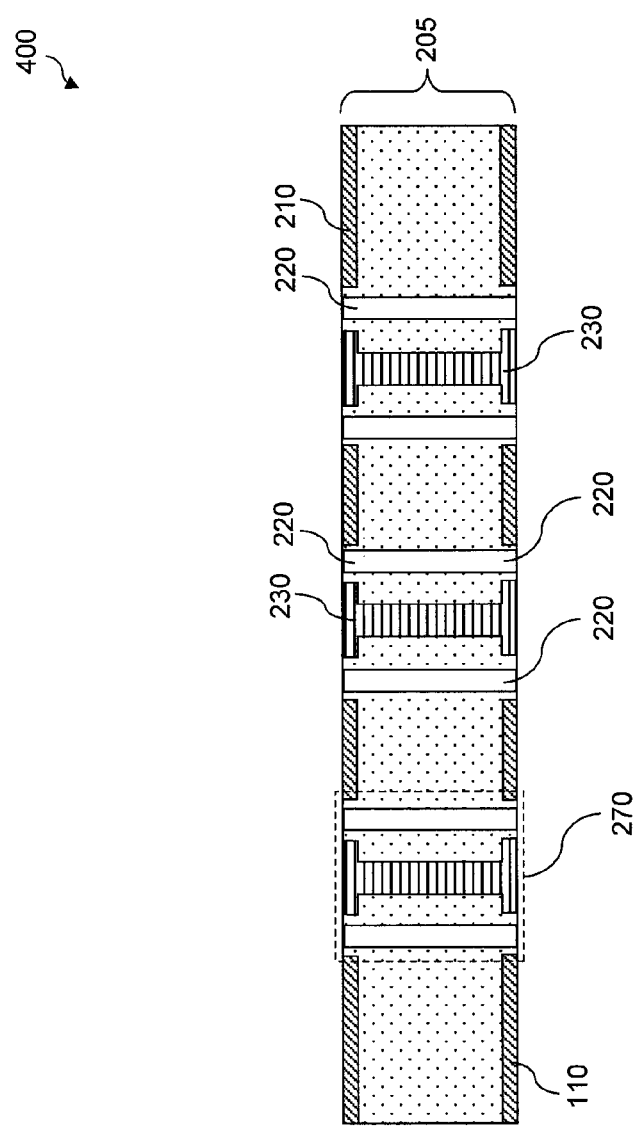
FIG. 4 is a cross-sectional diagram of an illustrative substrate layer in accordance with one embodiment of the present invention.

FIG. 4 is a cross-sectional diagram of an illustrative substrate layer 205 in accordance with one embodiment of the present invention. Substrate layer 205 may include metallization layer 210 that may cover a top and/or a bottom surface of substrate layer 205.

Multiple conductive vias (e.g., conductive vias 230) are formed in substrate layer 205. In the embodiment of FIG. 4, conductive vias 230 extend between the top surface and the bottom surface of substrate layer 205 to form signal transmission structures. For example, conductive via 230 may be plated through-hole vias. In another example, conductive via 230 may be blind or buried vias. In general, via holes or conductive vias 230 may be formed by drilling holes through a layer of substrate (e.g., substrate layer 205). Each via hole may be subsequently plated or filled with an electrically conductive material (e.g., copper).

When conductive vias 230 are formed in substrate layer 205, openings 220 may be formed adjacent to each or some of conductive vias 230. Each opening 220 may be a cylindrical cavity that extends through the upper and the bottom surfaces of substrate layer 205. A more detailed description of the structure of substrate layer 205, highlighted as substrate region 270, will be described later with reference to FIG. 5.

Figure 5:
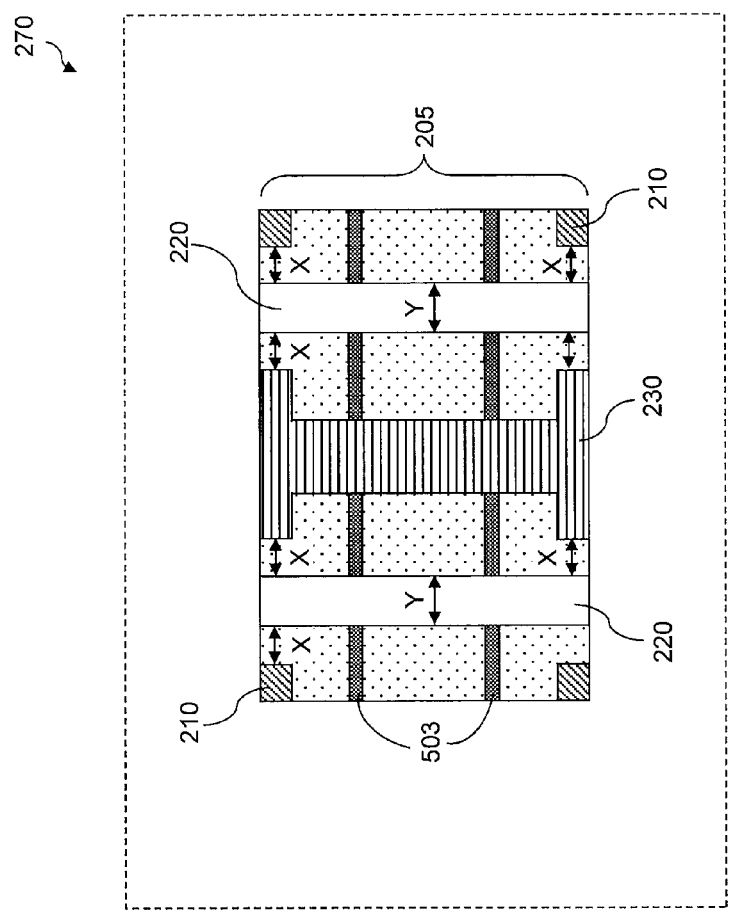
FIG. 5 is a cross-sectional view of a substrate region of a substrate layer in accordance with one embodiment of the present invention.

FIG. 5 is a cross-sectional view of substrate region 270 of substrate layer 205 in accordance with one embodiment of the present invention. Substrate layer 205 may contain one or more signal traces 503. Signal traces 503 are electrically conductive and may be formed from any suitable material, such as aluminum, gold, copper, etc. In one embodiment, signal traces 503 may be attached to conductive via 230.

Each of openings 220 has a height that is substantially equivalent to a thickness of conductive via 230. As shown in the embodiment of FIG. 5, each opening 220 has a width Y. Width Y may, for example, correspond to diameter M of circular openings such as opening 220 of FIG. 3. In one embodiment, openings 220 are formed by drilling (e.g., mechanically or by laser) evenly from a top surface of substrate layer 205 to a bottom surface of substrate layer 205. In one embodiment, openings 220 may be air holes. In an alternate embodiment, openings 220 may be filled with low loss material or dielectric material whose dielectric constant is different (e.g., lower dielectric constant) from that of substrate layer 205. This allows the tuning of the dielectric constant of substrate layer 205. The presence of openings 220 in substrate layer 205 may lower the effective dielectric constant of substrate layer 205 between the vias and nearby conductive materials such as conductive interconnects. As such, the impedance of conductive via 230 may substantially match the impedance of at least one of the signal traces 503, hence making conductive via 230 transparent (e.g., no significant change in signal) to signal propagation. This may prevent signal reflection and minimize signal distortion. In another embodiment, the dimensions, distribution, and fill materials of openings 230 may be adjusted to match the impedance of conductive via 230 to signal traces 503.

A gap of distance X may be formed between the edge of metallization layer 210 and opening 220. Another gap of distance X may also be formed between conductive via 230 and opening 220. The presence of such gaps is to prevent short-circuit effects during signal transmission between logic circuitries (not shown in the figure) on substrate layer 205. The distance X may be, for example, about 50 µm.

Figure 6:
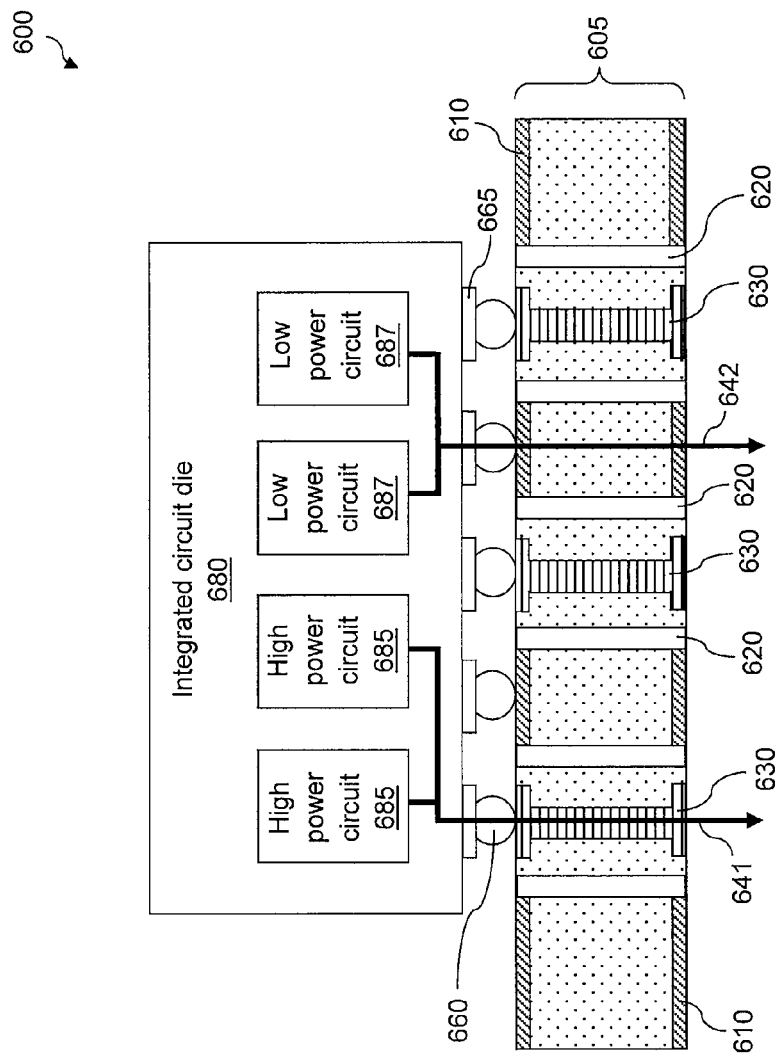
FIG. 6 shows an illustrative integrated circuit package in accordance with one embodiment of the present invention.

FIG. 6 shows an illustrative integrated circuit package 600 in accordance with one embodiment of the present invention. As shown in FIG. 6, integrated circuit die 680 may be placed on substrate layer 605. Integrated circuit die 680 may be mechanically and electrically connected to substrate layer 605 by contact pads 665 and interconnects 660 (e.g., solder balls or bumps). Conductive vias 630 may be connected to logic circuits (e.g., high power circuits 685, low power circuits 687) in integrated circuit die 680 either directly through signal paths or internal traces (not shown in the figure) in metallization layer 610 on substrate layer 605 or indirectly through the interconnects 660. The metallization layer 610, together with interconnects 660, may provide electrical connections from integrated circuit package 600 to a printed circuit board (not shown in the figure), which may also host other electronic circuits.

For example, as shown in the embodiment of FIG. 6, signal transmission path 641 may be used to transmit high speed signals from high power circuits 685 through conductive vias 630. In another example, signal transmission path 642 may be used to transmit low speed signals from low power circuits 687 through conventional via technology (not shown in the figure) in substrate layer 605. It should be appreciated that the direction of travel for such signals may be unidirectional and/or bidirectional. In another embodiment, signal transmission path 641 include conductive vias 630 in substrate layer 605. In general, vias may be considered transparent to signal transmission when the impedance of the conductive vias equals the characteristic impedance of the transmission lines (e.g., signal traces 503 of FIG. 5) attached to the conductive vias. In other words, power loss may be minimized when the transmission lines and the conductive vias are impedance matched. Openings 620 may help reduce parasitic capacitance between conductive vias 630 and adjacent transmission lines, which helps to reduce impedance mismatch.

Figure 7:
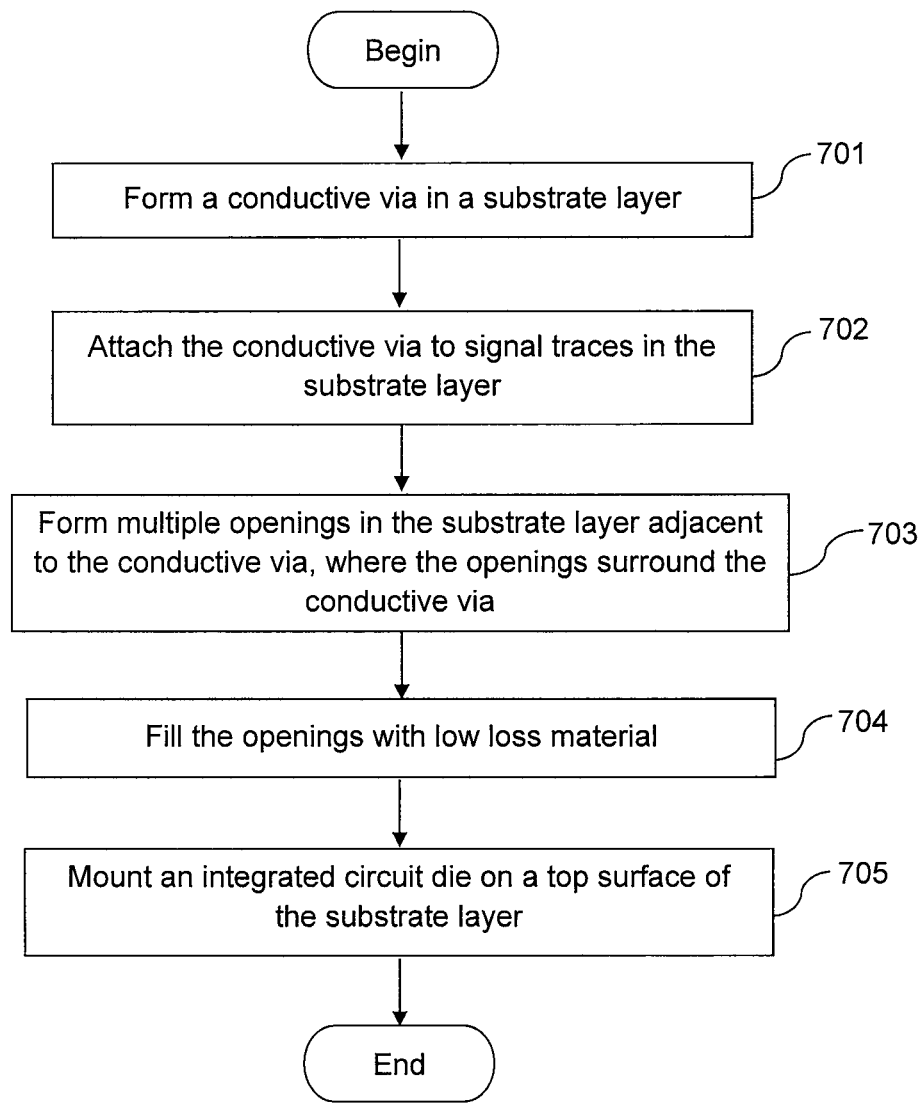
FIG. 7 is an illustrative flowchart for manufacturing a package substrate in accordance with an embodiment of the present invention.

FIG. 7 is an illustrative flowchart for manufacturing a package substrate in accordance with an embodiment of the present invention. At step 701, a conductive via is formed in a substrate layer. As an example, the conductive via is formed in the substrate layer by drilling a hole through the substrate layer. This is followed by plating the wall of the hole with an electrically conductive material (e.g., copper). In one embodiment, the conductive via may extend between the upper and lower surfaces of the substrate layer. For example, the conductive via may be a plated through hole via.

At step 702, the conductive via may be electrically connected to signal traces in the substrate layer. For example, as shown in FIG. 5, conductive via 230 may be attached to signal traces 503 in substrate layer 205 (e.g., conductive materials such as copper may be deposited and patterned to form signal traces 503 that contact conductive via 230). At high frequencies, signal traces 503 may act as transmission lines for signals to other circuitries. Generally, conductive vias are characterized by a relatively large parasitic capacitance and may exhibit capacitive and/or inductive discontinuity behaviors. Such behaviors may contribute to signal degradation (e.g., reflections, noise, jitter, etc.) as signals pass through the conductive vias.

At step 703, multiple openings are formed in the substrate layer adjacent to the conductive via, where the openings surround the conductive via. The opening may be formed by drilling (e.g., mechanically or by laser) evenly from a top surface of the substrate layer to a bottom surface of the substrate layer. As shown in FIG. 3, openings 220 may be distributed substantially evenly and surrounding conductive vias 230 in substrate layer 205 to reduce the dielectric constant of substrate layer 205. Having a lower dielectric constant within substrate layer 205 may improve high frequency performance by reducing the parasitic capacitance of conductive vias 230. For example, openings 220 may be air holes or air cylinders.

At step 704, the openings are filled with low loss material. For example, the low loss material may be dielectric material with lower dielectric constant from that of the substrate layer. The presence of the low loss material in the openings allows the tuning of the dielectric constant of the substrate layer to reduce return loss on signal paths (e.g., signal transmission path 641 of FIG. 6) during signal propagation through the openings.

At step 705, an integrated circuit die is attached on a top surface of the substrate layer. As shown in FIG. 6, integrated circuit die 680 may be placed (e.g., mounted) on the top surface of substrate layer 605. Interconnects 660 may be placed between die integrated circuit die 680 and substrate 605 to form signal pathways for signal transmission between integrated circuit die 680 and substrate layer 605. For example, interconnects 660, such as microbumps, may electrically couple integrated circuit die 680 and substrate layer 605.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. Apparatus, comprising:
   a substrate layer having upper and lower surfaces;
   a conductive via that extends from the upper surface to the lower surface of the substrate layer; and
   at least three metal-free openings in the substrate layer that surround the conductive via.

2. The apparatus defined in claim 1 wherein the at least three metal-free openings include partial height holes which are substantially equal in diameter.

3. The apparatus defined in claim 1 wherein each of the at least three metal-free openings is distributed substantially evenly in the substrate layer surrounding the conductive via to reduce the dielectric constant of the substrate layer.

4. The apparatus defined in claim 1 wherein each of the at least three metal-free openings is filled with air.

5. The apparatus defined in claim 1 wherein each of the at least three metal-free openings is filled with low loss material.

6. The apparatus defined in claim 1 wherein each of the at least three metal-free openings comprises a cylindrical cavity that extends through the upper and the bottom surfaces of the substrate layer.

7. The apparatus defined in claim 1 further comprising:
   an integrated circuit die mounted on the upper surface of the substrate layer.

8. Circuitry, comprising:
   a substrate;
   a signal path on the substrate, wherein the signal path includes a via in the substrate; and
   at least one opening in a region of the substrate that is adjacent to the via and that is devoid of metal, wherein the at least one opening reduces signal insertion loss of the via, and wherein the at least one opening and the via have the same length.

9. The circuitry defined in claim 8 wherein the at least one opening surrounds the via.

10. The circuitry defined in claim 8 wherein the at least one opening has a height that is substantially equivalent to a thickness of the via.

11. The circuitry package defined in claim 10, wherein the at least one opening is distributed substantially evenly in the substrate and surrounding the via.

12. The circuitry defined in claim 8, wherein the via comprises a plated through-hole via.

13. The circuitry defined in claim 12, wherein the via further comprises a conductive lining that forms a barrel structure.

14. The circuitry defined in claim 8, wherein the at least one opening is filled with low loss material.

15. The circuitry defined in claim 8, wherein the at least one opening is substantially cylindrical.

16. Circuitry, comprising:
    a substrate layer with a first dielectric constant, comprising upper and lower surfaces;
    a conductive via formed in the substrate layer;
    a metal trace coupled to the conductive via; and
    an opening in the substrate layer that extends from the upper surface to the lower surface of the substrate layer, that changes the effective dielectric constant of a portion of the substrate layer, and that is filled with a solid medium with a second dielectric constant that is less than the first dielectric constant.

17. The circuitry of claim 16, wherein the portion of the substrate layer comprises a region between the conductive via and the metal trace, and wherein the opening in the substrate layer has a diameter that changes the effective dielectric constant of the portion to match a first impedance associated with the conductive via and a second impedance associated with the metal trace.

18. The circuitry of claim 16, further comprising:
    another opening that extends from the upper surface to the lower surface of the substrate layer, wherein the another opening is separated from the conductive via by a distance that changes the effective dielectric constant of another portion of the substrate layer in a way such that a first impedance associated with the conductive via matches with a second impedance associated with the metal trace.

19. The circuitry of claim 16, wherein the portion of the substrate layer comprises a region between the conductive via and the metal trace, and wherein the second dielectric constant lowers the effective dielectric constant in the region to match a first impedance associated with the conductive via and a second impedance associated with the metal trace.

20. The circuitry of claim 16, wherein the second dielectric constant is configured to reduce parasitic capacitance between the conductive via and the metal trace.

21. The circuitry of claim 16, wherein the second dielectric constant is configured to tune the impedance of the conductive via.

22. The circuitry of claim 16, wherein the substrate layer directly contacts the solid medium with the second dielectric constant that fills the opening in the substrate layer.

23. The apparatus of claim 1, wherein the at least three metal-free openings in the substrate layer extend only from the upper surface to the lower surface of the substrate layer.

24. The apparatus of claim 1, wherein each of the at least three metal-free openings in the substrate layer is filled with a common medium, and wherein each of the at least three metal-free openings in the substrate layer is uncovered.

25. The circuitry of claim 8, wherein the substrate has a first dielectric constant, and wherein the at least one opening in the region of the substrate is open-ended, the circuitry further comprising:
    a dielectric medium that fills the at least one opening, wherein the dielectric medium has a second dielectric constant that is less than the first dielectric constant.

* * * * *